(12) United States Patent
Tanaka

(10) Patent No.: US 9,288,454 B2
(45) Date of Patent: *Mar. 15, 2016

(54) COLOR IMAGING APPARATUS HAVING COLOR IMAGING ELEMENT

(71) Applicant: FUJIFILM Corporation, Tokyo (JP)

(72) Inventor: Seiji Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/501,949

(22) Filed: Sep. 30, 2014

(65) Prior Publication Data

US 2015/0029367 A1   Jan. 29, 2015

Related U.S. Application Data

(63) Continuation of application No. 13/560,458, filed on Jul. 27, 2012, now Pat. No. 8,878,970, which is a continuation of application No. PCT/JP2011/067420, filed on Jul. 29, 2011.

(30) Foreign Application Priority Data

Feb. 28, 2011  (JP) .................................. 2011-042831
Jul. 25, 2011   (JP) .................................. 2011-162413

(51) Int. Cl.
*H04N 3/14*   (2006.01)
*H04N 9/04*   (2006.01)
(Continued)

(52) U.S. Cl.
CPC .............. *H04N 9/045* (2013.01); *G06T 3/4015* (2013.01); *H01L 27/14621* (2013.01); *H04N 2209/045* (2013.01)

(58) Field of Classification Search
USPC ........ 348/222.1, 266–280; 382/162, 299, 300
See application file for complete search history.

(56) References Cited

U.S. PATENT DOCUMENTS

| | | |
|---|---|---|
| 5,604,530 A | 2/1997 | Saito et al. |
| 6,343,146 B1 | 1/2002 | Tsuruoka et al. |

(Continued)

FOREIGN PATENT DOCUMENTS

| | | |
|---|---|---|
| EP | 1 357 760 A1 | 10/2003 |
| EP | 1 793 620 A1 | 6/2007 |

(Continued)

OTHER PUBLICATIONS

A Russian Office Action issued in corresponding Russian Patent Application No. 2013138394 on Oct. 15, 2014, along with an English translation thereof.

(Continued)

*Primary Examiner* — Twyler Haskins
*Assistant Examiner* — Akshay Trehan
(74) *Attorney, Agent, or Firm* — Birch, Stewart, Kolasch & Birch, LLP

(57) ABSTRACT

A color imaging apparatus comprising: a color imaging element comprising a plurality of pixels and color filters of a color filter array arranged on the plurality of pixels, the color filter array including first filters corresponding to a first color that most contributes to obtaining luminance signals and second filters corresponding to two or more second colors, and the first filters including two or more sections adjacent each other in horizontal, vertical, and oblique directions; a direction determination unit acquiring pixel values of pixels of the two or more sections of the first filters near a target pixel of demosaicking processing and determining a correlation direction of luminance; a demosaicking processing unit that calculates a pixel value of another color at a pixel position of the target pixel and that uses one or more pixels of another color in the correlation direction to calculate the pixel value.

13 Claims, 9 Drawing Sheets

(51) Int. Cl.
*H01L 27/146* (2006.01)
*G06T 3/40* (2006.01)

(56) References Cited

U.S. PATENT DOCUMENTS

| | | |
|---|---|---|
| 6,970,597 B1 | 11/2005 | Olding et al. |
| 6,995,796 B2 | 2/2006 | Taubman |
| 7,027,091 B1 | 4/2006 | Reyneri et al. |
| 7,146,042 B2 | 12/2006 | Chen |
| 7,206,021 B2 | 4/2007 | Sasaki et al. |
| 7,755,682 B2 | 7/2010 | Lin |
| 8,164,042 B2 | 4/2012 | Tseng et al. |
| 8,199,812 B2 | 6/2012 | Ye et al. |
| 2002/0054208 A1 | 5/2002 | Goldstein et al. |
| 2002/0149686 A1 | 10/2002 | Taubman |
| 2003/0133028 A1 | 7/2003 | Morinaka et al. |
| 2004/0109068 A1 | 6/2004 | Mitsunaga et al. |
| 2004/0169747 A1 | 9/2004 | Ono et al. |
| 2006/0087567 A1 | 4/2006 | Guarnera et al. |
| 2006/0114526 A1 | 6/2006 | Hasegawa |
| 2006/0139468 A1 | 6/2006 | Wada |
| 2006/0203113 A1 | 9/2006 | Wada et al. |
| 2007/0013786 A1 | 1/2007 | Chiba et al. |
| 2007/0153104 A1 | 7/2007 | Ellis-Monaghan et al. |
| 2008/0151083 A1 | 6/2008 | Hains et al. |
| 2008/0247671 A1 | 10/2008 | Yasuma et al. |
| 2009/0066821 A1* | 3/2009 | Achong et al. ............. 348/273 |
| 2009/0096899 A1 | 4/2009 | Quan |
| 2010/0053351 A1 | 3/2010 | Lukac |
| 2010/0265352 A1 | 10/2010 | Nashizawa |
| 2010/0302423 A1 | 12/2010 | Adams, Jr. et al. |
| 2011/0019041 A1 | 1/2011 | Ishiwata et al. |
| 2011/0069189 A1 | 3/2011 | Venkataraman et al. |
| 2011/0234842 A1 | 9/2011 | Ishiga |
| 2012/0025060 A1 | 2/2012 | Iwata |
| 2012/0293694 A1 | 11/2012 | Hayashi et al. |
| 2012/0293696 A1 | 11/2012 | Tanaka |

FOREIGN PATENT DOCUMENTS

| | | |
|---|---|---|
| JP | 02-210996 A | 8/1990 |
| JP | 8-23542 A | 1/1996 |
| JP | 8-23543 A | 1/1996 |
| JP | 10-243407 A | 9/1998 |
| JP | 11-285012 A | 10/1999 |
| JP | 2000-308080 A | 11/2000 |
| JP | 2001-339735 A | 12/2001 |
| JP | 2004-221839 A | 8/2004 |
| JP | 2004-266369 A | 9/2004 |
| JP | 2005-136766 A | 5/2005 |
| JP | 2006-24999 A | 1/2006 |
| JP | 2006-157600 A | 6/2006 |
| JP | 2006-186965 A | 7/2006 |
| JP | 2007-37104 A | 2/2007 |
| JP | 2007-184904 A | 7/2007 |
| JP | 2007-306490 A | 11/2007 |
| JP | 2008-236620 A | 10/2008 |
| JP | 2008-258931 A | 10/2008 |
| JP | 2010-512048 A | 4/2010 |
| JP | 2010-104019 A | 5/2010 |
| JP | 2010-153511 A | 7/2010 |
| JP | 2011-523538 A | 8/2011 |
| JP | 5054856 B1 | 8/2012 |
| JP | 5054858 B1 | 8/2012 |
| RU | 2383967 C2 | 3/2010 |
| RU | 2 419 248 C2 | 5/2011 |
| WO | 02/056604 A1 | 7/2002 |
| WO | WO 2008/066698 A2 | 6/2008 |
| WO | 2009/151903 A2 | 12/2009 |

OTHER PUBLICATIONS

Adams, et al., "Color Processing in Digital Cameras", IEEE, vol. 18, No. 6, Nov. 1, 1998, XP-000805931, pp. 20-30.
Extended European Search Report issued in European Patent Application No. 11859950.5 on Oct. 28, 2014.
Keigo Hirakawa, "Spatio-Spectral Color Filter Array Design for Optimal Image Recovery", IEEE Transactions on Image Processing, vol. 17, No. 10, Oct. 1, 2008, XP011234206, pp. 1876-1890.
Li, et al., "Color Filter Arrays: A Design Methodology", University of London—Department of Computer Science, May 2008, XP-002730894, pp. 1-21.
Parulski, et al., "High-performance digital color video camera", 8403 Journal of Electronic Imaging, Jan. 1, 1992, XP000323326, pp. 35-45.
Extended European Search Report issued in European Patent Application No. 11859479.5 on Aug. 4, 2014.
Extended European Search Report issued in European Patent Application No. 11860499.0 on Jul. 30, 2014.
ISR & Written Opinion in PCT/JP2012/080898 (English translation is attached).
ISR & Written Opinion in PCT/JP2012/080899 (English translation is attached).
ISR & Written Opinion in PCT/JP2012/081644 (English translation is attached).
ISR & Written Opinion in PCT/JP2012/083583 (English translation is attached).
Extended European Search Report issued in European Patent Application No. 11859802.8 on Mar. 4, 2015.
Sebastiano Battiato, et al., "Recent Patents on Color Demosaicing"; Recent Patents on Computer Science; vol. 1, No. 3, 9; Jan. 9, 2010; pp. 194-207; XP055099231; ISSN: 1874-4796.
Xin Li, et al., "Image Demosaicing: A Systematic Survey"; Proceedings of SPIE; vol. 6822, Jan. 27, 2008; pp. 68221J-1 through 68221J-15; XP055053687; ISSN 0277-786X.
A Russian Decision on Grant issued in corresponding Russian Patent Application No. 2013139022 on Mar. 10, 2015, along with an English translation thereof.
Russian Decision on Grant for Russian Application No. 2013138724/07, dated Dec. 11, 2014, with an English translation.
Japanese Office action issued in corresponding Japanese Patent Application No. 2012-165734 on Jun. 25, 2015.
Japanese Office action issued in related Japanese Patent Application No. 2012-165732 on Jun. 25, 2015.
U.S. Office action issued in related U.S. Appl. No. 13/887,024 on May 21, 2015.
European Office action issued in corresponding European Patent Application No. 11 859 950.5 on Jul. 10, 2015.
Japanese Office Action issued in corresponding Japanese Patent Application No. 2012-152815 on Oct. 23, 2015, along with an English translation thereof.
U.S. Office Action issued in related U.S. Appl. No. 13/887,024 on Nov. 24, 2015.

* cited by examiner

FIG.11

COLOR IMAGING APPARATUS HAVING COLOR IMAGING ELEMENT

This application is a Continuation of copending application Ser. No. 13/560,458, filed on Jul. 27, 2012, which is a Continuation application and claims the priority benefit under 35 U.S.C. §120 of PCT Application No. PCT/JP2011/067420 filed on Jul. 29, 2011 which application designates the U.S., and also claims the priority benefit under 35 U.S.C. §119 of Japanese Patent Applications No. 2011-042831 filed on Feb. 28, 2011 and No. 2011-162413 filed on Jul. 25, 2011, which applications are all hereby incorporated in their entireties by reference.

TECHNICAL FIELD

The present invention relates to a color imaging apparatus, and particularly, to a color imaging apparatus that can suppress generation of color moire.

BACKGROUND ART

In a color imaging apparatus including a single-plate color imaging element, an output image from the color imaging element is a RAW image (mosaic image). Therefore, a multichannel image is obtained by a process of interpolating a pixel of a missing color from a surrounding pixel (demosaicing processing). In this case, there is a problem in reproduction characteristics of a high-frequency image signal.

A primary-color Bayer array as a color array most widely used in the single-plate color imaging element includes green (G) pixels arranged in a check pattern and red (R) and blue (B) arranged line-sequentially. Therefore, there is a problem of low-frequency coloring (color moire) caused by folding of high frequency signals exceeding reproduction bands of the colors and caused by deviation of phases of the colors.

For example, a black and white oblique high frequency image as shown in FIG. 14(A) enters an imaging element in a Bayer array shown in FIG. 14(B), and the image is sorted into Bayer color arrays to compare the colors. As shown in FIGS. 14(C) to 14(E), R and B form light and flat color images, while G forms a dark and flat color image. Assuming that the value of black is 0 and the value of white is 255, the black and white oblique high frequency image turns green, because only G is 255. In this way, the oblique high frequency image cannot be correctly reproduced in the Bayer array.

In the color imaging apparatus using the single-plate color imaging element, an optical low-pass filter formed by an anisotropic substance such as crystal is generally arranged on the front side of the color imaging element to prevent optically reducing the high frequency wave. However, although the coloring caused by folding of the high frequency signal can be reduced in the method, there is a problem that the resolution is reduced accordingly.

To solve the problem, a color imaging element is proposed, wherein a color filter array of the color imaging element is a three-color random array satisfying array restrictions in which an arbitrary target pixel is adjacent to three colors including the color of the target pixel on four sides of the target pixel (PTL 1).

An image sensor of a color filter array is also proposed, wherein the image sensor includes a plurality of filters with different spectral sensitivity, and first and second filters among the plurality of filters are alternately arranged in a first predetermined period in one of the diagonal directions of a pixel grid of the image sensor and are alternately arranged in a second predetermined period in the other diagonal direction (PTL 2).

Meanwhile, PTL 3 describes a technique of using surrounding pixels of a target pixel of a mosaic image in a Bayer array to calculate correlations in horizontal, vertical, and oblique (NE, NW) directions (four directions), and weights are applied according to ratios of the calculated correlations to interpolate the pixels.

An image apparatus including a color imaging element is also proposed, wherein R and B among the three primary colors of RGB are arranged every three pixels in horizontal and vertical directions, and G is arranged between R and B (PTL 4). In the color imaging element described in PTL 4, G pixels that most contribute to obtaining luminance signals are arranged much more than RB pixels, on the ground that the resolution of color difference signals can be lower than the resolution of the luminance signals. This can increase the resolution in the horizontal and vertical directions.

CITATION LIST

Patent Literature

{PTL 1}
Japanese Patent Application Laid-Open No. 2000-308080
{PTL 2}
Japanese Patent Application Laid-Open No. 2005-136766
{PTL 3}
Japanese Patent Application Laid-Open No. 2010-104019
{PTL 4}
Japanese Patent Application Laid-Open No. 8-23543

SUMMARY OF INVENTION

Technical Problem

The three-color random array described in PTL 1 is effective for low-frequency color moire, but is not effective for a false color of a high frequency section.

In the color filter array of the image sensor described in PTL 2, the R, G, and B filters are periodically arranged in the lines in the horizontal and vertical directions of the color filter array. In demosaicing processing of a mosaic image output from the image sensor including the color filter array in the invention described in PTL 2, a local area in a predetermined image size is extracted around the target pixel, statistics related to a color distribution shape of the color of the target pixel in the local area and a color distribution shape of another color to be estimated are calculated, and the color distribution shapes are linearly regressed based on the intensity of the colors at the target pixel position and the statistics of the color distribution shapes to thereby calculate an estimation value of the another color at the target pixel position. The calculation of the statistics (covariance values) related to the color distribution shapes and the regression calculation process are necessary in the invention described in PTL 2, and there is a problem that the image processing is complicated.

Meanwhile, the pixel interpolation method described in PTL 3 is applied to a mosaic image in a Bayer array. However, G pixels are not consecutive in the horizontal and vertical directions in the Bayer array, and the correlations in the horizontal and vertical directions cannot be calculated at minimum pixel intervals. For example, the correlations are falsely determined when a vertical-striped or horizontal-striped high frequency wave is input, and there is a problem that the pixels cannot be accurately interpolated.

The ratio of the G pixels relative to the RB pixels in the color imaging element described in PTL 4 is higher than the ratio in the Bayer array, and the resolution in the horizontal and vertical directions can be increased. However, the RGB signals output from the color imaging element are uniformly synchronized by interpolation filters in the imaging apparatus described in PTL 4, and there is a problem that a false color is easily generated.

The present invention has been made in view of the circumstances, and an object of the present invention is to provide a color imaging apparatus that can suppress generation of a false color of a high frequency section by simple image processing.

Solution to Problem

To attain the object, an invention according to an aspect of the present invention includes: a single-plate color imaging element including: a plurality of pixels including photoelectric conversion elements arranged in horizontal and vertical directions; and color filters of a predetermined color filter array arranged on the plurality of pixels, wherein the color filter array includes first filters corresponding to a first color that most contributes to obtaining luminance signals and second filters corresponding to two or more second colors other than the first color, the first and second filters being periodically arranged, and the first filters include two or more sections adjacent to each other in horizontal, vertical, and oblique (NE, NW) directions; an image acquisition unit that acquires a mosaic image corresponding to the color filter array from the color imaging element; a direction determination unit that acquires, for a target pixel of demosaicing processing extracted from the mosaic image, pixel values of pixels corresponding to the first filters near the target pixel and adjacent to each other in the horizontal, vertical, and oblique (NE, NW) directions and that determines which one of the horizontal, vertical, and oblique (NE, NW) directions is a correlation direction of luminance based on the pixel values of the adjacent pixels; a demosaicing processing unit that calculates a pixel value of another color at a pixel position of the target pixel of the demosaicing processing extracted from the mosaic image and that uses one or more pixel values of one or more pixels of another color in the correlation direction determined by the direction determination unit to calculate the pixel value; and a control unit that repeatedly operates the direction determination unit and the demosaicing processing unit while shifting the target pixel of the demosaicing processing extracted from the mosaic image by a target pixel unit of the demosaicing processing.

The color filter array of the color imaging element includes sections where two or more first filters that most contribute to obtaining the luminance signals are adjacent to each other in the horizontal, vertical, and oblique (NE, NW) directions (four directions). Therefore, which one of the four directions is the correlation direction of luminance can be determined at minimum pixel intervals based on the pixel values of the pixels adjacent to each other in the directions. In the calculation of the pixel value of another color at the pixel position of the target pixel of the demosaicing processing extracted from the mosaic image, one or more pixel values of the one or more pixels of another color in the determined correlation direction can be used to accurately estimate the pixel value of the pixel of another color, and the generation of the false color at the high frequency section can be suppressed.

In the color imaging apparatus according another aspect of the present invention, the predetermined color filter array of the color imaging element includes a basic array pattern including the first and second filters, the basic array pattern is repeatedly arranged in the horizontal and vertical directions, and one or more of the first filters and one or more of the second filters are arranged in each line in the horizontal and vertical directions of the basic array pattern. One or more of the first filters and one or more of the second filters are arranged in each line in the horizontal and vertical directions of the basic array pattern. Therefore, the generation of color moire (false color) in the horizontal and vertical directions can be suppressed to improve the resolution. The basic array pattern is repeated in the horizontal and vertical directions in the color filter array. Therefore, demosaicing (interpolation) processing in a later stage can be executed according to the repeated pattern.

Preferably, in the color filter array of the color imaging apparatus according to another aspect of the present invention, the first filters are arranged at a center and four corners of a 3×3 pixel group, and the 3×3 pixel group is repeatedly arranged in the horizontal and vertical directions. The first filters are arranged at four corners of the 3×3 pixel group. Therefore, if the 3×3 pixel group is repeatedly arranged in the horizontal and vertical directions, the color filter array includes square arrays corresponding to 2×2 pixels including the first filters. The pixel values of the 2×2 pixels can be used to determine the direction with high correlation among the horizontal, vertical, and oblique (NE, NW) directions.

Preferably, in the color filter array of the color imaging apparatus according to another aspect of the present invention, the first filters are vertically and horizontally arranged across a filter at a center of a 3×3 pixel group, and the 3×3 pixel group is repeatedly arranged in the horizontal and vertical directions. The first filters are vertically and horizontally arranged across the filter at the center of the 3×3 pixel group. Therefore, if the 3×3 pixel group is repeatedly arranged in the horizontal and vertical directions, the first filters are adjacent to each other (in two pixels) in the horizontal and vertical directions across the filter at the center of the 3×3 pixel group in the color filter array. The pixel values of the pixels (eight pixels in total) corresponding to the first filters can be used to determine the correlation direction of the four directions.

In the color imaging apparatus according to another aspect of the present invention, the direction determination unit calculates difference absolute values of pixel values of adjacent pixels in each of the horizontal, vertical, and oblique (NE, NW) directions and determines a direction with a minimum difference absolute value among the difference absolute values in the directions as the correlation direction.

In the color imaging apparatus according to another aspect of the present invention, the direction determination unit calculates ratios of pixel values of adjacent pixels in each of the horizontal, vertical, and oblique (NE, NW) directions and determines a direction with the ratio closest to 1 among the ratios in the directions as the correlation direction.

A plurality of difference absolute values or ratios may be calculated for each of the directions, and a sum or an average value of the plurality of difference absolute values or an average value of the ratios may be calculated for each of the directions. In this case, the correlation direction can be determined more accurately.

In the color imaging apparatus according to another aspect of the present invention, the demosaicing processing unit sets the pixel value of a pixel of another color in the correlation direction determined by the direction determination unit as the pixel value of the another color at the pixel position of the target pixel, or sets a value obtained by interpolating the pixel values of a plurality of pixels of another color in the correlation direction determined by the direction determination unit as the pixel value of the another color at the pixel position of the target pixel.

In the color imaging apparatus according to another aspect of the present invention, if there is no pixel of the another color in the correlation direction determined by the direction determination unit, the demosaicing processing unit interpolates the pixel value of the target pixel based on a color difference or a color ratio at the pixel positions of the pixels of the another color near the target pixel to calculate the pixel value of the another color. The color difference and the color ratio at the pixel positions of the pixels of the another color denote a difference (color difference) and a ratio (color ratio) between the pixel value of the pixel at the pixel position and the pixel value of the another color already estimated by the direction determination in the correlation direction.

In the color imaging apparatus according to another aspect of the present invention, the color filters include R filters, G filters, and B filters corresponding to red (R), green (G), and blue (B) colors, wherein when the target pixel of the demosaicing processing is a G pixel, the pixel value is G, and there are no R and B pixels in the correlation direction determined by the direction determination unit, if the pixel values of R and B pixels near the G pixel are R and B, and the pixel values of G at the pixel positions of the pixels are $G_R$ and $G_B$, the demosaicing processing unit calculates pixel values $R_G$ and $B_G$ of the R and B pixels at the position of the target pixel by following formulas $$R_G = G + (R - G_R) \text{ and } B_G = G + (B - G_B), \text{ wherein}$$

when the target pixel of the demosaicing processing is an R pixel, the pixel value is R, and there are no G and B pixels in the correlation direction determined by the direction determination unit, if the pixel values of G and B pixels near the R pixel are G and B, and the pixel values of R at the pixel positions of the pixels are $R_G$ and $R_B$, the demosaicing processing unit calculates pixel values $G_R$ and $B_R$ of the G and B pixels at the position of the target pixel by following formulas $$G_R = R + (G - R_G) \text{ and } B_R = R + (B - R_B), \text{ and wherein}$$

when the target pixel of the demosaicing processing is a B pixel, the pixel value is B, and there are no G and R pixels in the correlation direction determined by the direction determination unit, if the pixel values of G and R pixels near the B pixel are G and R, and the pixel values of B at the pixel positions of the pixels are $B_G$ and $B_R$, the demosaicing processing unit calculates pixel values $G_B$ and $R_B$ of the G and R pixels at the position of the target pixel by following formulas $$G_B = B + (G - B_G) \text{ and } R_B = B + (R - B_R).$$

In the color imaging apparatus according to another aspect of the present invention, the color filters include R filters, G filters, and B filters corresponding to red (R), green (G), and blue (B) colors, wherein when the target pixel of the demosaicing processing is a G pixel, the pixel value is G, and there are no R and B pixels in the correlation direction determined by the direction determination unit, if the pixel values of R and B pixels near the G pixel are R and B, and the pixel values of G at the pixel positions of the pixels are $G_R$ and $G_B$, the demosaicing processing unit calculates pixel values $R_G$ and $B_G$ of the R and B pixels at the position of the target pixel by following formulas $$R_G = G \times (R/G_R) \text{ and } B_G = G \times (B/G_B), \text{ wherein}$$

when the target pixel of the demosaicing processing is an R pixel, the pixel value is R, and there are no G and B pixels in the correlation direction determined by the direction determination unit, if the pixel values of G and B pixels near the R pixel are G and B, and the pixel values of R at the pixel positions of the pixels are $R_G$ and $R_B$, the demosaicing processing unit calculates pixel values $G_R$ and $B_R$ of the G and B pixels at the position of the target pixel by following formulas $$G_R = R \times (G/R_G) \text{ and } B_R = R \times (B/R_B), \text{ and wherein}$$

when the target pixel of the demosaicing processing is a B pixel, the pixel value is B, and there are no G and R pixels in the correlation direction determined by the direction determination unit, if the pixel values of G and R pixels near the B pixel are G and R, and the pixel values of B at the pixel positions of the pixels are $B_G$ and $B_R$, the demosaicing processing unit calculates pixel values $G_B$ and $R_B$ of the G and R pixels at the position of the target pixel by following formulas $$G_B = B \times (G/B_G) \text{ and } R_B = B \times (R/B_R).$$

In the color imaging apparatus according to another aspect of the present invention, the direction determination unit determines that there is no correlation direction when difference values of the pixel values of the pixels adjacent to each other in the horizontal, vertical, and oblique (NE, NW) directions are equal, and if the direction determination unit determines that there is no correlation direction, the demosaicing processing unit uses one or more pixel values of one or more pixels of another color near the pixel position of the target pixel of the demosaicing processing to calculate the pixel value of the another color at the pixel position.

In the color imaging apparatus according to another aspect of the present invention, the color filters include R filters, G filters, and B filters corresponding to red (R), green (G), and blue (B) colors, and the filter array includes: a first array corresponding to 3×3 pixels, the first array including G filters arranged at a center and four corners, B filters vertically arranged across the G filter at the center, and R filters horizontally arranged across the G filter at the center; and a second array corresponding to 3×3 pixels, the second array including G filters arranged at a center and four corners, R filters vertically arranged across the G filter at the center, and B filters horizontally arranged across the G filter at the center, wherein the first and second arrays are alternately arranged in the horizontal and vertical directions.

According to the color filter array with the configuration, when 5×5 pixels (local area of mosaic image) are extracted around the first or second array, there are 2×2 G pixels at four corners of the 5×5 pixels. The pixel values of the 2×2 G pixels can be used to determine the correlation direction of the four directions.

In the color imaging apparatus according to another aspect of the present invention, the color filters include R filters, G filters, and B filters corresponding to red (R), green (G), and blue (B) colors, and the filter array includes: a first array corresponding to 3×3 pixels, the first array including an R filter arranged at a center, B filters arranged at four corners, and G filters vertically and horizontally arranged across the R filter at the center; and a second array corresponding to 3×3 pixels, the second array including a B filter arranged at a center, R filters arranged at four corners, and G filters vertically and horizontally arranged across the B filter at the center, wherein the first and second arrays are alternately arranged in the horizontal and vertical directions.

According to the color filter array with the configuration, when 5×5 pixels (local area of mosaic image) are extracted around the first or second array, there are G pixels adjacent to each other in the horizontal and vertical directions across the pixel (R pixel or B pixel) at the center of the 5×5 pixels. The pixel values of the G pixels (eight pixels in total) can be used to determine the correlation direction of the four directions.

Advantageous Effects of Invention

According to the present invention, a color imaging element including color filters including sections where two or more first filters that most contribute to obtaining luminance signals are adjacent to each other in horizontal, vertical, and oblique (NE, NW) directions (four directions) is used. The color imaging element includes the first filters and second filters corresponding to two or more second colors other than a first color that are periodically arranged in lines in the horizontal and vertical directions. A correlation direction of luminance is determined based on difference values of pixel values of pixels adjacent to each other in the directions. Therefore, the pixel values at minimum pixel intervals can be used to determine the correlation direction. In calculation of a pixel value of another color at a pixel position of a target pixel of demosaicing processing extracted from a mosaic image, the pixel value of a pixel of the another color in the determined correlation direction is used to calculate the pixel value of the another color at the pixel position of the target pixel. Therefore, the pixel value of the pixel of the another color can be accurately estimated, and generation of a false color at a high frequency section can be suppressed.

BRIEF DESCRIPTION OF DRAWINGS

FIG. 11 is a diagram showing a fifth embodiment of the color imaging element applied to the present invention.

DESCRIPTION OF EMBODIMENTS

Hereinafter, preferred embodiments of a color imaging apparatus according to the present invention will be described in detail with reference to the attached drawings.

{Overall Configuration of Color Imaging Apparatus}

Figure 1:
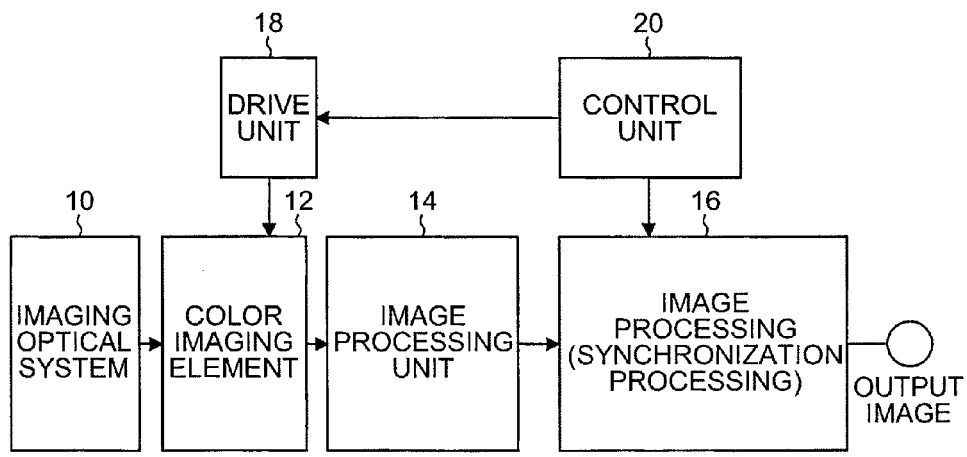
FIG. 1 is a block diagram showing embodiments of a color imaging apparatus according to the present invention.

FIG. 1 is a block diagram showing embodiments of the color imaging apparatus according to the present invention.

An imaging optical system 10 images a subject, and an optical image indicating a subject image is formed on a light receiving surface of a color imaging element 12 (color imaging element of a first embodiment).

The color imaging element 12 is a single-plate color imaging element including: a plurality of pixels (not shown) including photoelectric conversion elements arranged in horizontal and vertical directions (two-dimensional array); and color filters in a predetermined color filter array arranged on light receiving surfaces of the pixels. The color filter array of the color imaging element 12 is characterized by including: filters of all red (R), green (G), and blue (B) colors periodically arranged in lines in the horizontal and vertical directions; and sections where two or more G filters corresponding to Gs that most contribute to obtaining luminance signals are adjacent to each other in horizontal, vertical, and oblique (NE, NW) directions. Details of the color imaging element 12 will be described later.

The photoelectric conversion elements convert the subject image formed on the color imaging element 12 to signal charges corresponding to amounts of incident light. The signal charges accumulated on the photoelectric conversion elements are sequentially read out from the color imaging element 12 as voltage signals (image signals) corresponding to the signal charges based on drive pulses provided from a drive unit 18 according to an instruction of a control unit 20. The image signals read out from the color imaging element 12 are R, G, and B signals indicating a mosaic image of R, G, and B corresponding to the color filter array of the color imaging element 12. The color imaging element 12 is not limited to a CCD (Charge Coupled Device) color imaging element and may be another type of imaging element such as a CMOS (Complementary Metal Oxide Semiconductor) imaging element.

The image signals read out from the color imaging element 12 are input to an image processing unit 14. The image processing unit 14 includes: a correlated double sampling circuit (CDS) that removes reset noise included in the image signals; an AGC (Automatic Gain Control) circuit that amplifies the image signals and controls the size at a certain level; and an A/D converter. The image processing unit 14 applies a correlated double sampling process to the input image signals and amplifies the image signals, and then outputs RAW data, which is formed by converting the image signals to digital image signals, to the image processing unit 16.

The image processing unit 16 includes a white balance correction circuit, a gamma correction circuit, a demosaicing processing circuit according to the present invention (processing circuit that calculates (converts to synchronous system) all color information of RGB of the pixels from the mosaic image of RGB associated with the color filter array of the single-plate color imaging element 12), a luminance/color difference signal generation circuit, a contour correction circuit, a color correction circuit, and the like. According to an instruction from the control unit 20, the image processing unit 16 applies required signal processing to the RAW data of the mosaic image input from the image processing unit 14 to generate image data (YUV data) including luminance data (Y data) and color difference data (Cr, Cb data).

For still images, a compression/expansion processing circuit applies a compression process, which is compliant with a JPEG (joint photographic experts group) standard, to the image data generated by the image processing unit 16. For moving images, the compression/expansion processing circuit applies a compression process, which is compliant with an MPEG2 (moving picture experts group) standard, to the image data. The image data is recorded in a recording medium (memory card) and is output and displayed on a display device (not shown) such as a liquid crystal monitor.

Details of the processing by the demosaicing processing circuit according to the present invention in the image processing unit 16 will be described later.

<Features of Color Filter Array>

The color filter array of the color imaging element 12 has the following features (1), (2), and (3).

{Feature (1)}

Figure 2:
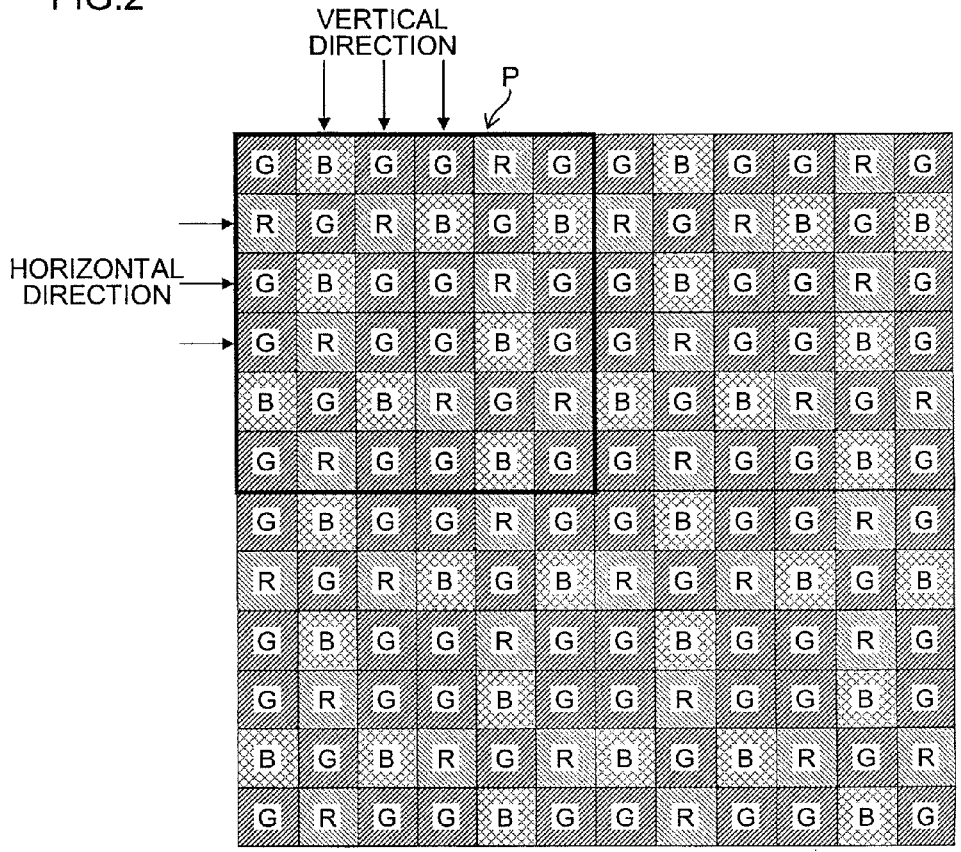
FIG. 2 is a diagram showing a color filter array of color filters arranged on a color imaging element of a first embodiment.

FIG. 2 is a diagram showing the color filter array of the color filters arranged on the color imaging element 12. As shown in FIG. 2, the color filter array of the color imaging element 12 includes a basic array pattern P (pattern indicated by a thick frame) formed by a square array pattern corresponding to 6×6 pixels, and the basic array pattern P is repeatedly arranged in the horizontal and vertical directions. Therefore, the color filter array includes filters of R, G, and B colors (R filters, G filters, and B filters) arranged in a predetermined cycle.

In this way, the R filters, the G filters, and the B filters are arranged in a predetermined cycle. Therefore, the demosaicing processing and the like of the R, G, and B signals read out from the color imaging element 12 can be processed according to the repeated pattern.

{Feature (2)}

In the color filter array shown in FIG. 2, the filters of all colors of R, G, and B are arranged in the lines in the horizontal and vertical directions of the basic array pattern P. Therefore, as described later, when a correlation direction is determined to be the horizontal direction or the vertical direction in the demosaicing processing, a pixel value of a pixel of another color in the horizontal direction or the vertical direction can be used for interpolation. Therefore, generation of color moire (false color) can be suppressed. Since the generation of false color can be controlled, it is possible not to arrange an optical low-pass filter on an optical path from a plane of incident to an imaging plane of the optical system. Even if the optical low-pass filter is applied, a filter with less effect of cutting high frequency components for preventing the generation of false color can be applied, and a loss of resolution can be prevented.

Figure 3:
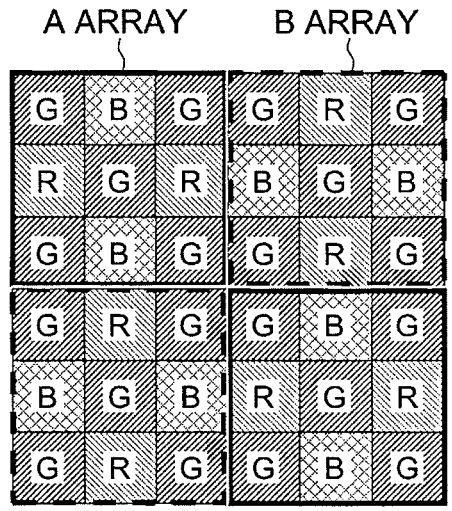
FIG. 3 is a diagram showing a basic array pattern included in the color filter array of the color imaging element of the first embodiment.

FIG. 3 shows a state in which the basic array pattern P shown in FIG. 2 is divided into four sets of 3×3 pixels.

Figure 4:
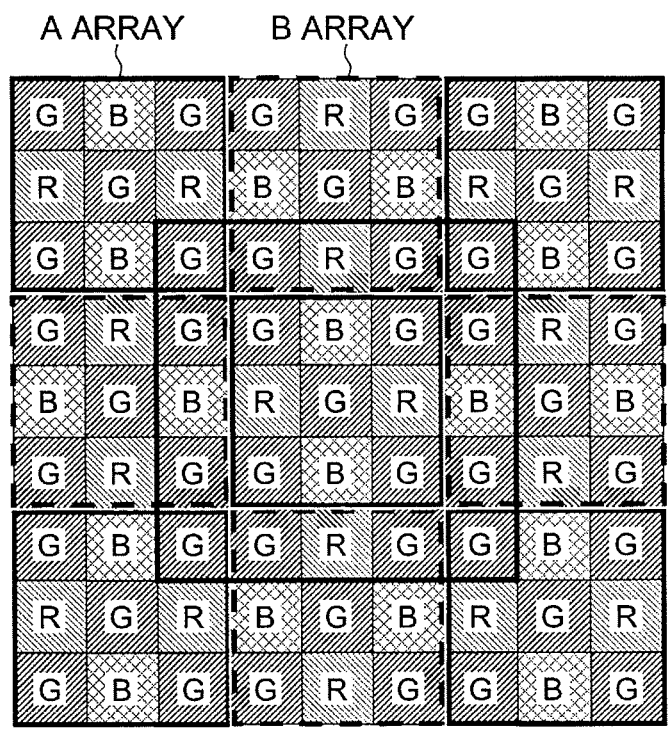
FIG. 4 is a diagram showing a state in which the basic array pattern of 6×6 pixels included in the color filter array of the color imaging element of the first embodiment is divided into A arrays and B arrays of 3×3 pixels.

As shown in FIG. 3, the basic array pattern P can be perceived as a pattern including A arrays of 3×3 pixels surrounded by a frame of solid lines and B arrays of 3×3 pixels surrounded by a frame of broken lines alternately arranged in the horizontal and vertical directions as shown in FIG. 4.

Each of the A and B arrays includes G filters as luminance pixels arranged at four corners and a center, and the G filters are arranged on both diagonals. In the A array, the R filters are arranged in the horizontal direction, and the B filters are arranged in the vertical direction, across the G filter at the center. Meanwhile, in the B array, the B filters are arranged in the horizontal direction, and the R filters are arranged in the vertical direction, across the G filter at the center. Therefore, although the positional relationship between the R and B filters is opposite in the A and B arrays, the rest of the arrangement is the same.

{Feature (3)}

The basic array pattern P of the color filter array shown in FIG. 2 includes sections where two or more G filters are adjacent to each other in the horizontal, vertical, and oblique (NE, NW) directions. The color filter array including the basic array patterns P arranged in the horizontal and vertical directions includes square arrays corresponding to 2×2 pixels of G filters.

This is because, as shown in FIG. 3, the G filters as luminance pixels are arranged at the four corners and the center of 3×3 pixels in the A and B arrays, and the 3×3 pixels are alternately arranged in the horizontal and vertical directions to form the G filters of square arrays corresponding to 2×2 pixels. The pixel values of the 2×2 pixels of G filters can be used to calculate the correlation direction of luminance (direction determination) in the horizontal direction, the vertical direction, and the oblique directions (NE, NW).

{Demosaicing Processing Circuit of Image Processing Unit 16}

The processing details of the demosaicing processing circuit of the image processing unit 16 will be described.

Figure 5:
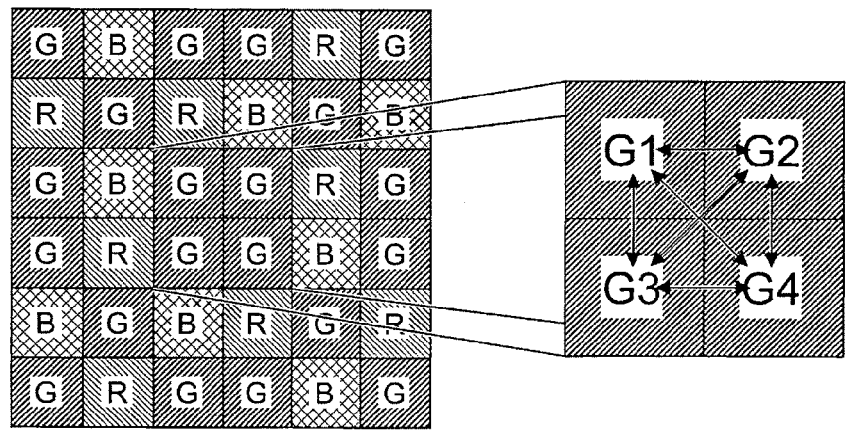
FIG. 5 is a diagram showing a state in which the basic array pattern of 6×6 pixels included in the color filter array of the color imaging element of the first embodiment are divided into A arrays and the B arrays of 3×3 pixels, and the A arrays and the B arrays are arranged.

As shown in FIG. 5, the G pixels of 2×2 pixels corresponding to the G filters are extracted from the mosaic image output from the color imaging element 12. When the pixel values of the G pixels are defined as G1, G2, G3, and G4 in the order from upper left to lower right, a direction determination circuit included in the demosaicing processing circuit calculates a difference absolute value of each direction.

More specifically, the difference absolute value in the vertical direction is $(|G1-G3|+|G2-G4|)/2$. The difference absolute value in the horizontal direction is $(|G1-G2|+|G3-G4|)/2$. The difference absolute value in an upper right oblique direction is $|G2-G3|$. The difference absolute value in an upper left oblique direction is $|G1-G4|$.

The direction determination circuit determines that there is a correlation (correlation direction) in the direction with the minimum difference absolute value among the four correlation absolute values.

Figure 6:
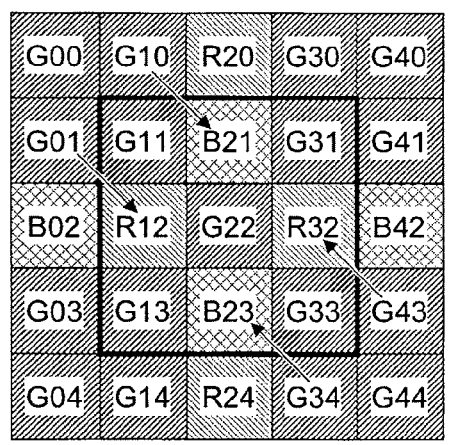
FIG. 6 is a diagram used to explain a determination method of a correlation direction of luminance and a pixel interpolation method in demosaicing processing.

When a local area of 5×5 pixels is extracted from the mosaic image so that the A array of 3×3 pixels (see FIG. 3) is positioned at the center as shown in FIG. 6, the G pixels of 2×2 pixels are arranged at four corners. Therefore, when the 3×3 pixels of the A array in the local area are target pixels of the demosaicing processing, the direction determination circuit calculates sums (or average values) of the correlation absolute values in the directions at four corners and determines the direction with the minimum value among the sums (or the average values) of the correlation absolute values in the directions as the correlation direction of luminance in the target pixels of the demosaicing processing.

Figure 7A:
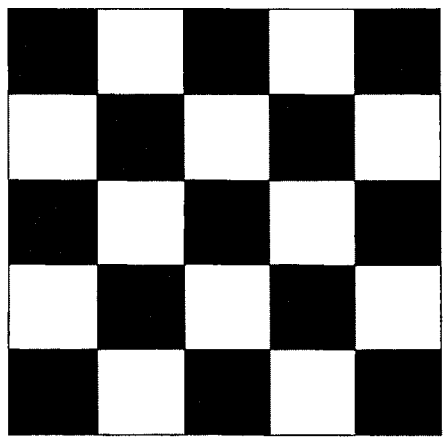
FIG. 7A is a diagram showing an oblique high frequency image incident on the color imaging element.
Figure 7B:
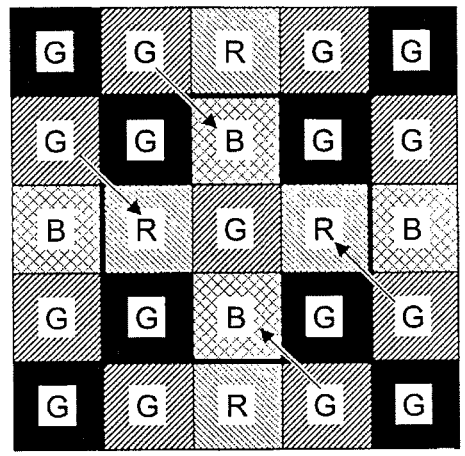
FIG. 7B is a diagram used to explain a determination method of the correlation direction when the oblique high frequency image is incident on the color imaging element.

When a pattern as shown in FIG. 7A is input (black is 0 and white is 255), the sum of the difference absolute values in the vertical direction of the pixel values of 2×2 G pixels at four corners shown in FIG. 7B is $|0-255|\times 8=2040$, and the sum of the difference absolute values in the horizontal direction is also $|0-255|\times 8=2040$. Meanwhile, the sum of the difference absolute values in the upper right oblique direction is $|255-255|\times 2+|0-0|\times 2=0$, and the sum of the difference absolute values in the upper left oblique direction is $|0-0|\times 2+|255-255|\times 2=0$. Therefore, there are two directions (the upper right oblique direction and the upper left oblique direction) with the minimum sum of the difference absolute values. However, an oblique maximum frequency is input in the pattern of FIG. 7A, and any one of the oblique directions can be adopted.

As described, since the correlation direction is determined from the 2×2 G pixels adjacent to each other, the correlation direction can be determined at minimum pixel intervals. Therefore, the correlation direction can be accurately determined without being affected by the high frequency wave.

In the embodiment, although the direction with the minimum change in the luminance (correlation direction with high correlation) is determined based on the difference values of the pixel values of adjacent G pixels, the arrangement is not limited to this. The direction with the minimum change in the luminance may be determined based on ratios of the pixels values of the adjacent G pixels. When the change in the luminance is determined based on the ratios of the pixel values of the adjacent G pixels, the direction with the ratio (average value of ratios when a plurality of ratios in four directions are calculated) closest to 1 is determined as the direction with the minimum change in the luminance.

A method of applying the demosaicing processing to the mosaic image of RGB by the demosaicing processing circuit of the image processing unit 16 will be described.

When the correlation direction in the target pixel of the demosaicing processing is determined, the demosaicing processing circuit uses one or more pixel values of one or more pixels of another color in the determined correlation direction when calculating the pixel value of the another color at the pixel position of the target pixel of the demosaicing processing.

As shown in FIG. 4, there are pixels of all colors (R pixels, G pixels, and B pixels) in the horizontal and vertical directions. Therefore, if it is determined that there is a correlation direction in the horizontal or vertical direction, the pixel value of a pixel of another color near the target pixel in the horizontal or vertical direction is acquired. The acquired pixel value of one pixel or a value obtained by interpolating the pixel values of a plurality of pixels is set as the pixel value of the another color at the pixel position of the target pixel.

For example, if it is determined that the correlation direction is the horizontal direction, the pixel value of R12 or R32 is set as the pixel value of R at the pixel position of the pixel of G22 in FIG. 6, or the pixel values of R12 and R32 are interpolated to determine the pixel value.

Similarly, the pixel value of B02 or B42 is set as the pixel value of B at the pixel position of the pixel of G22, or the pixel values of B02 and B42 are interpolated to determine the pixel value.

The pixel value of R12 is set as the pixel value of R at the pixel position of the pixel of B02, or the pixel values of R12 and R32 are interpolated to determine the pixel value.

The pixel value of G22 is set as the pixel value of G at the pixel position of the pixel of B02, or the pixel value of a G pixel at the same horizontal position of the adjacent B array and the pixel value of G22 are interpolated to determine the pixel value.

The pixel value of another color in the vertical direction can be similarly used when it is determined that the correlation direction is the vertical direction.

In the color filter array of the color imaging element 12 of the first embodiment, there are only G pixels in the oblique directions (diagonal directions) around the G pixel of the A array of 3×3 pixels. Therefore, if it is determined that the correlation direction is an oblique direction with consecutive G pixels, the pixel values of the other colors are calculated by interpolating the pixel value of the target pixel based on color differences between the pixel values of neighborhood R and B pixels where the pixel values of G are calculated.

As shown in FIG. 6, when it is determined that there is a correlation direction toward oblique upper left as a result of the direction determination, there are no R and B pixels in the interpolation direction of the pixel of G11. Therefore, color differences between pixel values R12 and R21 of the pixels of R12 and B21 near the pixel of G11 and pixel values R12' and G21' of G at the pixel positions of the pixels are used to interpolate the pixel value G11 of G11 to calculate pixel values R11' and B11' of R and G at the pixel position of the pixel of G11.

Specifically, the interpolation is performed by the following formulas.

$$R11'=G11+(R12-G12') \quad (a)$$

$$B11'=G11+(B21-B21') \quad (b)$$

In Expressions (a) and (b), G12'=G01 and G21'=G10. Therefore, the pixel values G12' and G21' are pixel values of G at the pixel positions of the pixels of R12 and B21 estimated by the direction determination in the oblique left direction.

Similarly, color differences between the pixel positions of the pixels of R12 and R32 near the R and B pixels at the pixel position of the pixel of G22 and the pixel positions of the pixels of B21 and B23 are used to interpolate the pixel value G22 of G22 to calculate the pixel values R22' and B22' of R and G at the pixel position of the pixel of G22.

Specifically, the interpolation is performed by the following formulas.

$$R22'=G22+\{(R12+R32)/2-(G12'+G32')/2)\} \quad (c)$$

$$B22'=G22+\{(B21+B23)/2-(G21'+G23')/2\} \quad (d)$$

In the formulas, G32'=G43 and G23'=G34.

When the demosaicing processing of all pixels of 3×3 pixels (A array) is finished, the same processing (the direction determination and the demosaicing processing) is applied to the target pixels of adjacent 3×3 pixels (B array), and the processing is repeated while shifting the processing by 3×3 pixels.

As described, in the color filter array of the color imaging element 12, only G pixels may exist in the oblique directions in the calculation of the pixel values of R and B at the pixel position of the G pixel as the target pixel of the demosaicing processing. Depending on the color filter array, there can be a case in which the target pixel of the demosaicing processing is an R pixel, and G pixels and B pixels do not exist in the oblique directions in the calculation of the pixel values of G and B at the pixel position. There can also be a case in which the target pixel of the demosaicing processing is a B pixel, and G pixels and the R pixels do not exist in the oblique directions in the calculation of the pixel values of G and R at the pixel position.

Even in these cases, the pixel values of the other colors can be calculated as in Expressions (a) to (d) by interpolating the pixel values of the target pixel based on the color differences between the pixel values of the neighborhood pixels where the pixel values of RGB are calculated.

The following is a summary of the method of calculating the pixel values of the other colors by interpolating the pixel values of the target pixel based on the color differences between the neighborhood pixels.

When the target pixel of the demosaicing processing is a G pixel, the pixel value is G, and there are no R and B pixels in the correlation direction determined by the direction determination circuit, if the pixel values of the R and B pixels near the G pixel are R and B, and the pixel values of G at the pixel positions of the pixels are $G_R$ and $G_B$, pixel values $R_G$ and $B_G$ of the R and B pixels at the position of the target pixel are calculated by the following formulas.

$$R_G=G+(R-G_R), B_G=G+(B-G_B) \quad (1)$$

Expression (1) is equivalent to Expressions (a) and (b).

Similarly, when the target pixel of the demosaicing processing is an R pixel, the pixel value is R, and there are no G and B pixels in the correlation direction determined by the direction determination circuit, if the pixel values of the G and B pixels near the R pixel are G and B, and the pixel values of R at the pixel positions of the pixels are $R_G$ and $R_B$, pixel values $G_R$ and $B_R$ of the G and B pixels at the position of the target pixel are calculated by the following formulas.

$$G_R=R+(G-R_G), B_R=G+(B-R_B) \quad (2)$$

When the target pixel of the demosaicing processing is a B pixel, the pixel value is B, and there are no G and R pixels in the correlation direction determined by the direction determination circuit, if the pixel values of the G and R pixels near the B pixel are G and R, and the pixel values of B at the pixel positions of the pixels are $B_G$ and $B_R$, pixel values $G_B$ and $R_B$ of the G and R pixels at the position of the target pixel are calculated by the following formulas.

$$G_B=B+(G-B_G), R_B=B+(R-B_R) \quad (3)$$

Other than Expressions (1) to (3), if there are a plurality of pixels in the same color as the color to be interpolated and calculated near the target pixel of the demosaicing processing, an average color difference of the plurality of pixels can be used for the interpolation as in Expressions (c) and (d).

In the embodiment, when there are no pixels of the other colors in the determined correlation direction with respect to the target pixel of the demosaicing processing, the pixel values of the target pixel are interpolated based on the color differences between the neighborhood pixels of the other colors to calculate the pixel values of the other colors. However, the arrangement is not limited to this. The pixel values of the target pixel may be interpolated based on color ratios of the neighborhood pixels of the other colors to calculate the pixel values of the other colors.

A specific example of a method of calculating the pixel values of the other colors by interpolating the pixel values of the target pixel based on the color ratios of the neighborhood pixels will be described below.

When the target pixel of the demosaicing processing is a G pixel, the pixel value is G, and there are no R and B pixels in the correlation direction determined by the direction determination circuit, if the pixel values of the R and B pixels near the G pixel are R and B, and the pixel values of G at the pixel positions of the pixels are $G_R$ and $G_B$, the pixel values $R_G$ and $B_G$ of the R and B pixels at the position of the target pixel are calculated by the following formulas.

$$R_G=G\times(R/G_R), B_G=G\times(B/G_B) \quad (4)$$

Similarly, when the target pixel of the demosaicing processing is an R pixel, the pixel value is R, and there are no G and B pixels in the correlation direction determined by the direction determination circuit, if the pixel values of the G and B pixels near the R pixel are G and B, and the pixel values of R at the pixel positions of the pixels are $R_G$ and $R_B$, the pixel values $G_R$ and $B_R$ of the G and B pixels at the position of the target pixel are calculated by the following formulas.

$$G_R=R\times(G/R_G), B_R=R\times(B/R_B) \quad (5)$$

When the target pixel of the demosaicing processing is a B pixel, the pixel value is B, and there are no G and R pixels in the correlation direction determined by the direction determination circuit, if the pixel values of the G and R pixels near the B pixel are G and R, and the pixel values of B at the pixel positions of the pixels are $B_G$ and $B_R$, the pixel values $G_B$ and $R_B$ of the G and R pixels at the position of the target pixel are calculated by the following formulas.

$$G_B=B\times(G/B_G), R_B=B\times(R/B_R) \quad (6)$$

The present invention is based on a color imaging element including R, G, and B pixels periodically arranged in the lines in the horizontal and vertical directions. However, when a color imaging element that also includes R, G, and B pixels periodically arranged in the oblique (NE, NW) directions is used, the pixel values of the other colors do not have to be interpolated and calculated by Expressions (1) to (6) or the like.

When the difference absolute values of the pixel values of the G pixels adjacent to each other in the horizontal, vertical and oblique (NE, NW) directions are equal to each other (when the difference absolute values are 0 or substantially 0 in all directions), the direction determination circuit determines that there is no correlation direction. In this case, the pixel values of the pixels of the other colors near the pixel position are used for the pixel values of the other colors at the pixel position of the target pixel of the demosaicing processing.

{Second Embodiment of Color Imaging Element}

Figure 8:
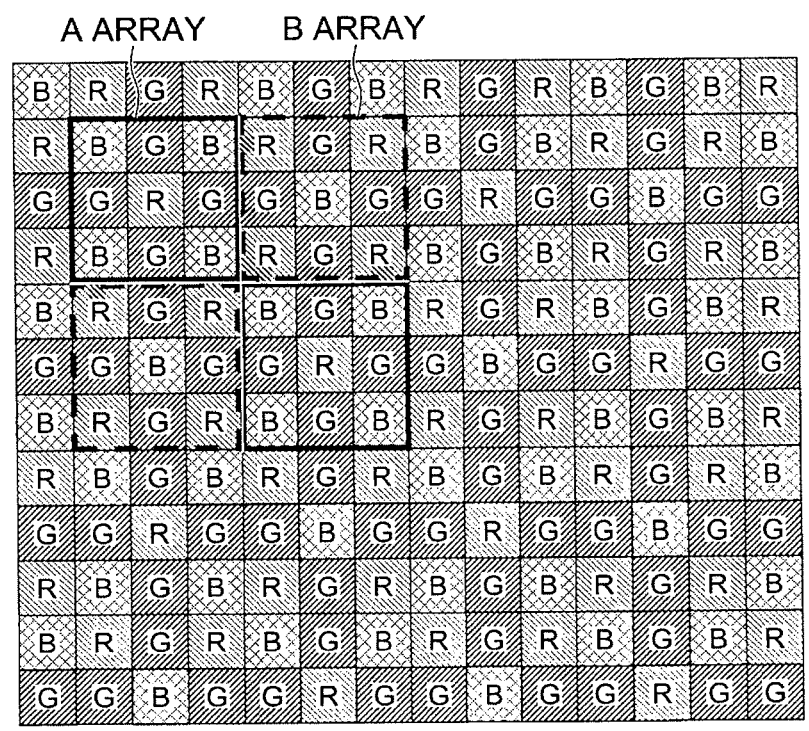
FIG. 8 is a diagram showing a second embodiment of the color imaging element applied to the present invention.

FIG. 8 is a diagram showing a second embodiment of the color imaging element applied to the present invention. FIG. 8 particularly shows a color filter array of the color filters arranged on the color imaging element.

As shown in FIG. 8, the color filter array of the color imaging element includes basic array patterns formed by square array patterns corresponding to 6×6 pixels, and the basic array pattern is repeatedly arranged in the horizontal and vertical directions. Therefore, the color filter array includes filters of R, G, and B colors (R filters, G filters, and B filters) arranged in a predetermined cycle.

The color filter array shown in FIG. 8 includes filters of all colors of R, G, and B arranged in the lines in the horizontal and vertical directions of the basic array pattern.

If the basic array pattern is divided into four sets of 3×3 pixels as shown in FIG. 8, the basic array pattern can also be perceived as a color filter array including A arrays of 3×3 pixels surrounding by frames of solid lines and B arrays of 3×3 pixels surrounded by frames of broken lines that are alternately arranged in the horizontal and vertical directions.

In the A array, the R filter is arranged at the center of 3×3 pixels, the B filters are arranged at four corners, and the G filters are vertically and horizontally arranged across the R filter at the center. Meanwhile, in the B array, the B filter is arranged at the center of 3×3 pixels, the R filters are arranged at four corners, and the G filters are vertically and horizontally arranged across the B filter at the center. Therefore, although the positional relationship between the R and B filters is opposite in the A and B arrays, the rest of the arrangement is the same.

The color filter array shown in FIG. 8 includes sections where two G filters are adjacent to each other in the horizontal, vertical, and oblique (NE, NW) directions.

The G filters as luminance pixels are vertically and horizontally arranged across the filter at the center of the 3×3 pixel group in the A or B array. Therefore, if the 3×3 pixel groups are repeatedly arranged in the horizontal and vertical directions, two pixels are arranged adjacent to each other in the horizontal and vertical directions across the filters at the centers of the 3×3 pixel groups.

According to the color filter array, the pixel values of the pixels (eight pixels in total) corresponding to the G filter as a luminance pixel allow determining the correlations of luminance in the horizontal, vertical, and oblique (NE, NW) directions based on the pixel values at minimum pixel intervals.

When 3×3 pixels corresponding to the A array are the target pixels of the demosaicing processing, there are consecutive G pixels in the horizontal and vertical directions across the R pixel at the center (G pixels are arranged in a cross shape). The correlations of luminance in the horizontal and vertical directions can be calculated based on the pixel values of the consecutive G pixels in the horizontal and vertical directions, and the correlations of luminance in the oblique directions (NE, NW) can be calculated from four vertical and horizontal G pixels adjacent to the R pixel.

The color filter array of the color imaging element of the second embodiment has the same features as the features (1), (2), and (3) of the color filter array of the color imaging element 12 of the first embodiment. The direction determination and the pixel interpolation according to the present invention can be performed.

In the color filter array of the color imaging element of the second embodiment, if, for example, the R pixel at the center of the A array or the B pixel at the center of the B array is the target pixel of the demosaicing processing, and it is determined that an oblique direction is the correlation direction, there are no G pixels in the oblique direction. In this case, the pixel values of G can be calculated based on Expressions (2) and (3) or Expressions (5) and (6).

{Third Embodiment of Color Imaging Element}

Figure 9:
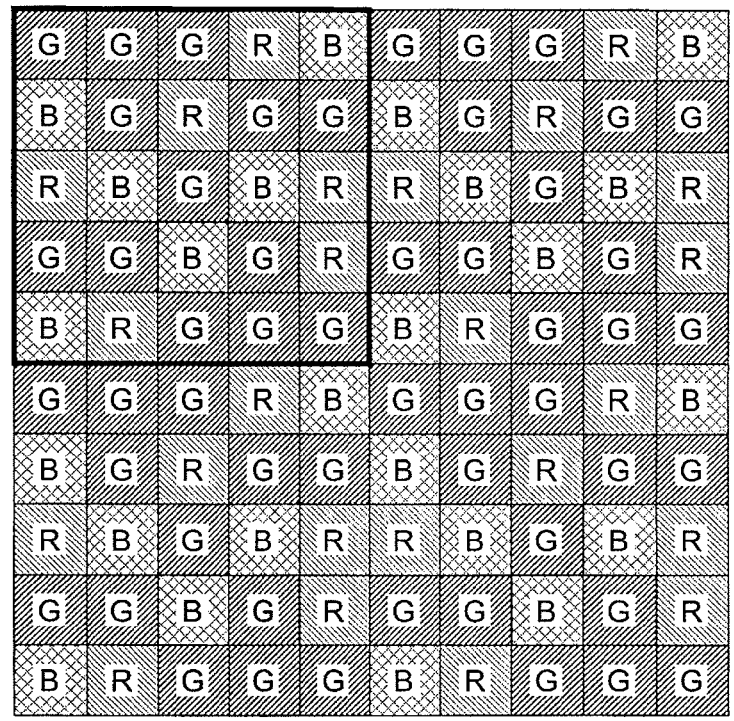
FIG. 9 is a diagram showing a third embodiment of the color imaging element applied to the present invention.

FIG. 9 is a diagram showing a third embodiment of the color imaging element applied to the present invention. FIG. 9 particularly shows a color filter array of the color filters arranged on the color imaging element.

As shown in FIG. 9, the color filter array of the color imaging element includes a basic array pattern (pattern indicated by a thick frame) formed by a square array pattern corresponding to 5×5 pixels. The basic array pattern is repeatedly arranged in the horizontal and vertical directions. Therefore, the color filter array includes filters of R, G, and B colors (R filters, G filters, and B filters) arranged in a predetermined cycle.

The color filter array shown in FIG. 9 includes filters of all colors of R, G, and B arranged in the lines in the horizontal and vertical directions of the basic array pattern.

In the basic array pattern, two or more consecutive G filters (G pixels) are arranged in the horizontal, vertical, and oblique directions (NE, NW). The pixel values of the consecutive G pixels allow determining the correlations of luminance in the horizontal, vertical, and oblique (NE, NW) directions at minimum pixel intervals.

The color filter array of the color imaging element of the third embodiment has the same features as the features (1), (2), and (3) of the color filter array of the color imaging element 12 of the first embodiment. The direction determination and the pixel interpolation according to the present invention can be performed.

{Fourth Embodiment of Color Imaging Element}

Figure 10:
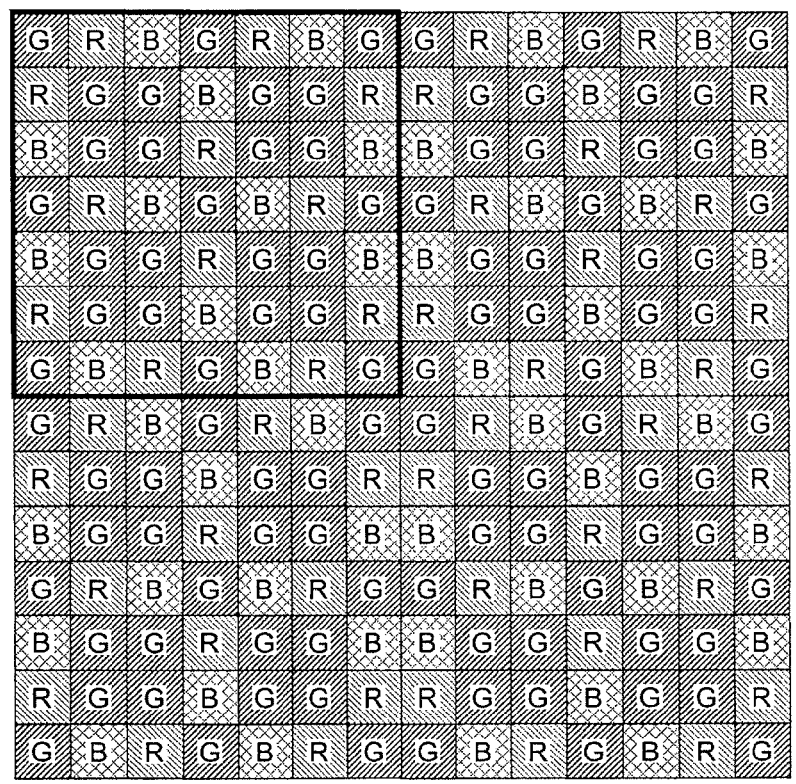
FIG. 10 is a diagram showing a fourth embodiment of the color imaging element applied to the present invention.

FIG. 10 is a diagram showing a fourth embodiment of the color imaging element applied to the present invention. FIG. 10 particularly shows a color filter array of the color filters arranged on the color imaging element.

As shown in FIG. 10, the color filter array of the color imaging element includes a basic array pattern (pattern indicated by a thick frame) formed by a square array pattern corresponding to 7×7 pixels, and the basic array pattern is repeatedly arranged in the horizontal and vertical directions. Therefore, the color filter array includes filters of R, G, and B colors (R filters, G filters, and B filters) arranged in a predetermined cycle.

In the color filter array shown in FIG. 10, the filters of all colors of R, G, and B are arranged in the lines in the horizontal and vertical directions of the basic array pattern.

In the basic array pattern, consecutive G filters (G pixels) are arranged in the horizontal, vertical, and oblique directions (NE, NW). More specifically, there are four sets of vertically and horizontally consecutive 2×2 G pixels in the basic array pattern.

The pixel values of the consecutive G pixels allow determining the correlations of luminance in the horizontal, vertical, and oblique (NE, NW) directions at minimum pixel intervals.

The color filter array of the color imaging element of the fourth embodiment has the same features as the features (1), (2), and (3) of the color filter array of the color imaging element 12 of the first embodiment. The direction determination and the pixel interpolation according to the present invention can be performed.

{Fifth Embodiment of Color Imaging Element}

Figure 11:
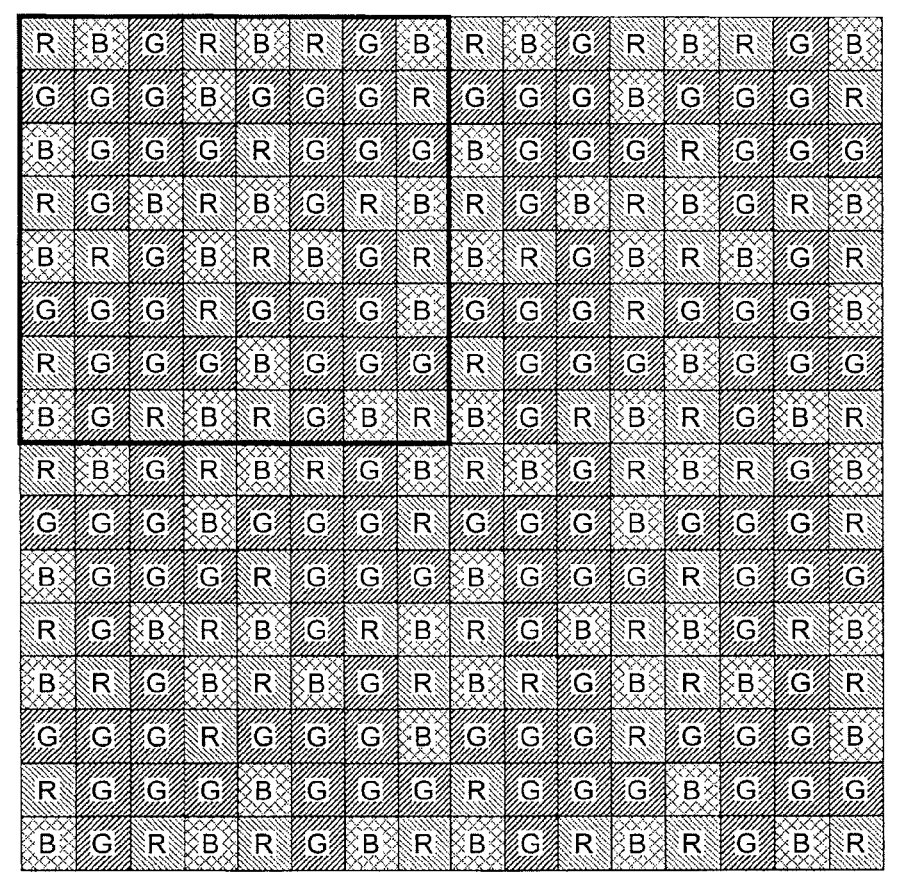

FIG. 11 is a diagram showing a fifth embodiment of the color imaging element applied to the present invention. FIG. 11 particularly shows a color filter array of the color filters arranged on the color imaging element.

As shown in FIG. 11, the color filter array of the color imaging element includes a basic array pattern (pattern indicated by a thick frame) formed by a square array pattern corresponding to 8×8 pixels, and the basic array pattern is repeatedly arranged in the horizontal and vertical directions. Therefore, the color filter array includes filters of R, G, and B colors (R filters, G filters, and B filters) arranged in a predetermined cycle.

The color filter array shown in FIG. 11 includes filters of all colors of R, G, and B arranged in the lines in the horizontal and vertical directions of the basic array pattern.

In the basic array pattern, consecutive G filters (G pixels) are arranged in the horizontal, vertical, and oblique directions (NE, NW). More specifically, there are four sets of G pixels including vertically and horizontally consecutive 2×2 pixels in the basic array pattern.

The pixel values of the consecutive G pixels allow determining the correlations of luminance in the horizontal, vertical, and oblique (NE, NW) directions at minimum pixel intervals.

The color filter array of the color imaging element of the fifth embodiment has the same features as the features (1), (2), and (3) of the color filter array of the color imaging element 12 of the first embodiment. The direction determination and the pixel interpolation according to the present invention can be performed.

{Sixth and Seventh Embodiments of Color Imaging Element}

Figure 12:
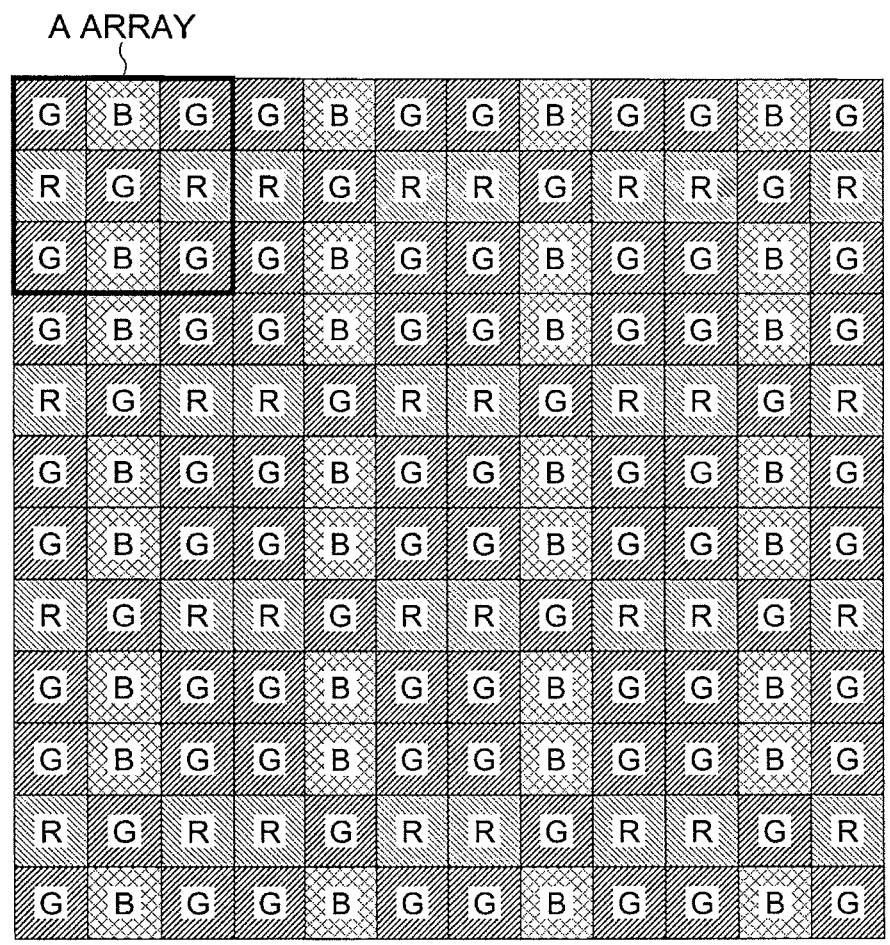
FIG. 12 is a diagram showing a sixth embodiment of the color imaging element applied to the present invention.
Figure 13:
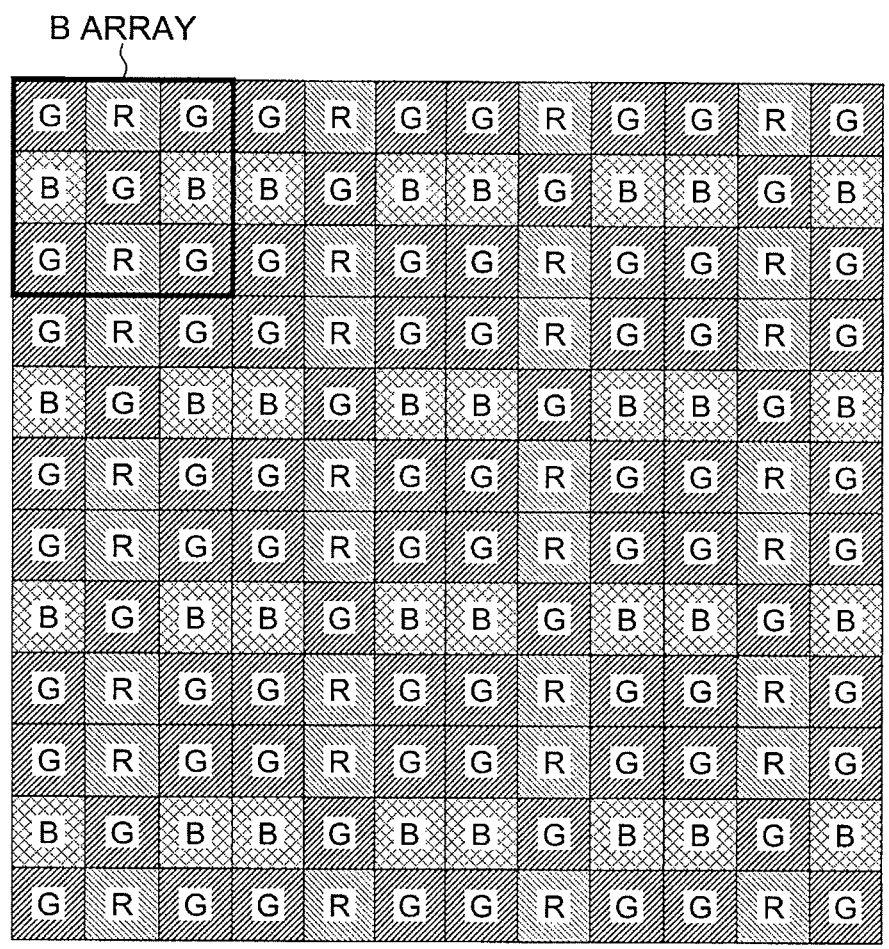
FIG. 13 is a diagram showing a seventh embodiment of the color imaging element applied to the present invention.
Figure 14:
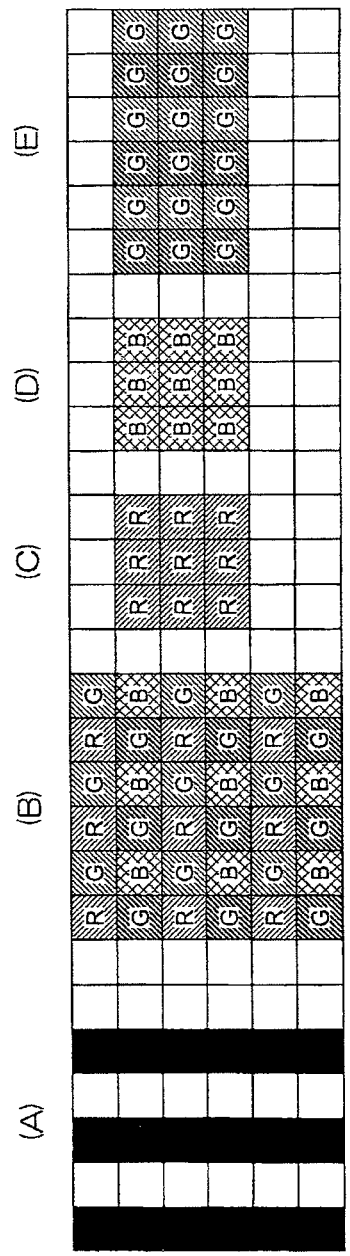
FIG. 14 is a diagram used to explain a problem of a conventional color imaging element including color filters in a Bayer array.

FIGS. 12 and 13 are diagrams respectively showing sixth and seventh embodiments of the color imaging element applied to the present invention. FIGS. 12 and 13 particularly show color filter arrays of the color filters arranged on the color imaging element.

The color filter array of the color imaging element of the sixth embodiment shown in FIG. 12 includes the A arrays of 3×3 pixels of the first embodiment shown in FIG. 3 arranged in the horizontal and vertical directions.

Meanwhile, the color filter array of the color imaging element of the seventh embodiment shown in FIG. 13 includes the B arrays of 3×3 pixels of the first embodiment shown in FIG. 3 arranged in the horizontal and vertical directions.

The basic array patterns are small (3×3 pixels) in the color filter arrays of the color imaging element of the sixth and seventh embodiments, and there is an advantageous effect that the demosaicing processing of the R, G, and B signals is facilitated.

Meanwhile, the filters of all colors of R, G, and B are not arranged in the lines in the horizontal and vertical directions in the basic array patterns, and the arrays do not have the feature (2) of the color filter array of the color imaging element 12 of the first embodiment. However, the arrays have the same features as the features (1) and (3), and the direction determination and the pixel interpolation according to the present invention can be performed.

{Others}

Although the color imaging apparatus including the color imaging element with color filters of three primary colors of RGB has been described in the embodiments, the present invention is not limited to this. The present invention can also be applied to a color imaging apparatus including a color imaging element with color filters of four colors including three primary colors of RGB and another color (for example, emerald (E)).

The present invention can also be applied to a color imaging apparatus including a color imaging element with color filters of four complementary colors including G in addition to C (cyan), M (magenta), and Y (yellow) that are complementary colors of the primary colors RGB.

It is obvious that the present invention is not limited to the embodiments, and various modifications can be made without departing from the spirit of the present invention.

REFERENCE SIGNS LIST

10 . . . imaging optical system, 12 . . . color imaging element, 14 . . . image processing unit, 16 . . . image processing unit, 18 . . . drive unit, 20 . . . control unit

What is claimed:

1. A color imaging apparatus comprising:
a single-plate color imaging element comprising: a plurality of pixels including photoelectric conversion elements arranged in a horizontal direction and a vertical direction; and color filters of a predetermined color filter array arranged on the plurality of pixels, wherein the color filter array includes first filters corresponding to a first color that most contributes to obtaining luminance signals and second filters corresponding to two or more second colors other than the first color, the first and second filters being periodically arranged, and the color filter array includes a first portion in which two or more pixels corresponding to the first filters are adjacent to each other in the horizontal direction with no pixel corresponding to colors other than the first color therebetween, a second portion in which two or more pixels corresponding to the first filters are adjacent to each other in the vertical direction with no pixel corresponding to colors other than the first color therebetween, a third portion in which two or more pixels corresponding to the first filters are adjacent to each other in an upper right oblique direction with no pixel corresponding to colors other than the first color therebetween, and a fourth portion in which two or more pixels corresponding to the first filters are adjacent to each other in an upper left oblique direction with no pixel corresponding to colors other than the first color therebetween;
an image acquisition unit configured to acquire a mosaic image corresponding to the color filter array from the color imaging element;
a direction determination unit configured to acquire, for a target pixel for demosaicing processing extracted from the mosaic image, pixel values which correspond to the first filters near the target pixel and are conterminously arranged in each of the horizontal direction, the vertical direction, the upper right oblique direction and the upper left oblique direction, the direction determination unit configured to determine which one of the horizontal direction, the vertical direction, the upper right oblique direction and the upper left oblique direction is a correlation direction of luminance based on the pixel values of the conterminously arranged pixels; and
a demosaicing processing unit configured to calculate a pixel value of another color at a pixel position of the target pixel for the demosaicing processing extracted from the mosaic image, the demosaicing processing unit configured to use a pixel value of a pixel of the another color in the correlation direction determined by the direction determination unit to calculate the pixel value of the another color,
wherein the direction determination unit calculates difference absolute values of pixel values of adjacent pixels in each of the horizontal direction, the vertical direction, the upper right oblique direction and the upper left oblique direction and determines a direction with a minimum difference absolute value among the difference absolute values as the correlation direction.

2. The color imaging apparatus according to claim 1, wherein the color filter array includes a basic array pattern including the first filters and the second filters, the basic array pattern is repeatedly arranged in the horizontal direction and the vertical direction, and
one or more of the first filters and one or more of the second filters are arranged in each line in the horizontal direction and the vertical direction in the basic array pattern.

3. The color imaging apparatus according to claim 1, wherein in the color filter array, the first filters are arranged at a center and four corners of a 3×3 pixel group, and the 3×3 pixel group is repeatedly and tightly arranged in the horizontal direction and the vertical direction.

4. The color imaging apparatus according to claim 1, wherein in the color filter array, the first filters are vertically and horizontally arranged across a filter at a center of a 3×3 pixel group, and the 3×3 pixel group is repeatedly and tightly arranged in the horizontal direction and the vertical direction.

5. The color imaging apparatus according to claim 1, wherein the demosaicing processing unit sets the pixel value of a pixel of the another color in the correlation direction determined by the direction determination unit as the pixel value of the another color at the pixel position of the target pixel, or sets a value obtained by interpolating the pixel values of a plurality of pixels of the another color in the correlation direction determined by the direction determination unit as the pixel value of the another color at the pixel position of the target pixel.

6. The color imaging apparatus according to claim 1, wherein if there is no pixel of the another color in the correlation direction determined by the direction determination unit, the demosaicing processing unit interpolates the pixel value of the target pixel based on a color difference or a color ratio at the pixel positions of the pixels of the another color near the target pixel to calculate the pixel value of the another color.

7. The color imaging apparatus according to claim 6, wherein the color filters include R filters, G filters, and B filters corresponding to red, green, and blue colors,
wherein when the target pixel for the demosaicing processing is a G pixel, a pixel value thereof is G, and there are no R and B pixels in the correlation direction determined by the direction determination unit, if pixel values of R and B pixels near the G pixel are R and B, and pixel values of green at pixel positions of the pixels are $G_R$ and $G_B$, the demosaicing processing unit calculates pixel values $R_G$ and $B_G$ of R and B pixels at the position of the target pixel by following formulas $R_G=G+(R-G_R)$ and $B_G=G+(B-G_B)$, wherein when the target pixel for the demosaicing processing is an R pixel, a pixel value thereof is R, and there are no G and B pixels in the correlation direction determined by the direction determination unit, if pixel values of G and B pixels near the R pixel are G and B, and pixel values of red at pixel positions of the pixels are $R_G$ and $R_B$, the demosaicing processing unit calculates pixel values $G_R$ and $B_R$ of G and B pixels at the position of the target pixel by following formulas $G_R=R+(G-R_G)$ and $B_R=R+(B-R_B)$, and wherein when the target pixel for the demosaicing processing is a B pixel, a pixel value thereof is B, and there are no G and R pixels in the correlation direction determined by the direction determination unit, if pixel values of G and R pixels near the B pixel are G and R, and pixel values of blue at pixel positions of the pixels are $B_G$ and $B_R$, the demosaicing processing unit calculates pixel values $G_B$ and $R_B$ of G and R pixels at the position of the target pixel by following formulas $G_B=B+(G-B_G)$ and $R_B B+(R-B_R)$.

8. The color imaging apparatus according to claim 6, wherein the color filters include R filters, G filters, and B filters corresponding to red, green, and blue colors,
wherein when the target pixel for the demosaicing processing is a G pixel, a pixel value thereof is G, and there are no R and B pixels in the correlation direction determined by the direction determination unit, if pixel values of R and B pixels near the G pixel are R and B, and pixel values of green at pixel positions of the pixels are $G_R$ and $G_B$, the demosaicing processing unit calculates pixel values $R_G$ and $B_G$ of R and B pixels at the position of the target pixel by following formulas $R_G=G\times(R/G_R)$ and $B_G=G\times(B/G_B)$, wherein when the target pixel for the demosaicing processing is an R pixel, a pixel value thereof is R, and there are no G and B pixels in the correlation direction determined by the direction determination unit, if pixel values of G and B pixels near the R pixel are G and B, and pixel values of red at pixel positions of the pixels are $R_G$ and $R_B$, the demosaicing processing unit calculates pixel values $G_R$ and $B_R$ of G and B pixels at the position of the target pixel by following formulas $G_R=R\times(G/R_G)$ and $B_R=R\times(B/R_B)$, and wherein when the target pixel of the demosaicing processing is a B pixel, a pixel value thereof is B, and there are no G and R pixels in the correlation direction determined by the direction determination unit, if pixel values of G and R pixels near the B pixel are G and R, and pixel values of blue at pixel positions of the pixels are $B_G$ and $B_R$, the demosaicing processing unit calculates pixel values $G_B$ and $R_B$ of G and R pixels at the position of the target pixel by following formulas $G_B=B\times(G/B_G)$ and $R_B=B\times(R/B_R)$.

9. The color imaging apparatus according to claim 1,
wherein the direction determination unit determines that there is no correlation direction when difference values of pixel values of pixels adjacent to each other in the horizontal direction, the vertical direction, the upper right oblique direction and the upper left oblique direction are equal, and
if the direction determination unit determines that there is no correlation direction, the demosaicing processing unit uses pixel value of a pixel of another color near the pixel position of the target pixel for the demosaicing processing to calculate the pixel value of the another color at the pixel position of the target pixel.

10. The color imaging apparatus according to claim 1, further comprising
a control unit configured to repeatedly operate the direction determination unit and the demosaicing processing unit while shifting the target pixel for the demosaicing processing extracted from the mosaic image by a target pixel unit of the demosaicing processing.

11. A color imaging apparatus comprising:
a single-plate color imaging element comprising: a plurality of pixels including photoelectric conversion elements arranged in a horizontal direction and a vertical direction; and color filters of a predetermined color filter array arranged on the plurality of pixels, wherein the color filter array includes first filters corresponding to a first color that most contributes to obtaining luminance signals and second filters corresponding to two or more second colors other than the first color, the first and second filters being periodically arranged, and two or more pixels out of a plurality of pixels corresponding to the first filters are arranged so that the two or more pixels are adjacent to each other in each of the horizontal direction, the vertical direction, an upper right oblique direction and an upper left oblique direction;
an image acquisition unit configured to acquire a mosaic image corresponding to the color filter array from the color imaging element;
a direction determination unit configured to acquire, for a target pixel for demosaicing processing extracted from the mosaic image, pixel values which correspond to the first filters near the target pixel and are conterminously arranged in each of the horizontal direction, the vertical direction, the upper right oblique direction and the upper left oblique direction, the direction determination unit configured to determine which one of the horizontal direction, the vertical direction, the upper right oblique direction and the upper left oblique direction is a correlation direction of luminance based on the pixel values of the conterminously arranged pixels; and
a demosaicing processing unit configured to calculate a pixel value of another color at a pixel position of the target pixel for the demosaicing processing extracted from the mosaic image, the demosaicing processing unit configured to use a pixel value of a pixel of the another color in the correlation direction determined by the direction determination unit to calculate the pixel value of the another color,
wherein the direction determination unit calculates ratios of pixel values of adjacent pixels in each of the horizontal direction, the vertical direction, the upper right oblique direction and the upper left oblique direction and determines a direction with a ratio closest to 1 among the ratios of the horizontal direction, the vertical direction, the upper right oblique direction and the upper left oblique direction as the correlation direction.

12. A image processing method for a single-plate color imaging element comprising: a plurality of pixels including photoelectric conversion elements arranged in a horizontal direction and a vertical direction; and color filters of a predetermined color filter array arranged on the plurality of pixels, wherein the color filter array includes first filters corresponding to a first color that most contributes to obtaining luminance signals and second filters corresponding to two or more second colors other than the first color, the first and second filters being periodically arranged, and the color filter array includes a first portion in which two or more pixels corresponding to the first filters are adjacent to each other in the horizontal direction with no pixel corresponding to colors other than the first color therebetween, a second portion in which two or more pixels corresponding to the first filters are adjacent to each other in the vertical direction with no pixel corresponding to colors other than the first color therebetween, a third portion in which two or more pixels corresponding to the first filters are adjacent to each other in an upper right oblique direction with no pixel corresponding to colors other than the first color therebetween, and a fourth portion in which two or more pixels corresponding to the first filters are adjacent to each other in an upper left oblique direction with no pixel corresponding to colors other than the first color therebetween, the method comprising:
acquiring a mosaic image corresponding to the color filter array from the color imaging element;
acquiring, for a target pixel for demosaicing processing extracted from the mosaic image, pixel values which correspond to the first filters near the target pixel and are conterminously arranged in each of the horizontal direction, the vertical direction, the upper right oblique direction and the upper left oblique direction and determining which one of the horizontal direction, the vertical direction, the upper right oblique direction and the upper left oblique direction is a correlation direction of luminance based on the pixel values of the conterminously arranged pixels, wherein difference absolute values of pixel values of adjacent pixels are calculated in each of the horizontal direction, the vertical direction, the upper right oblique direction and the upper left oblique direction, and a direction with a minimum difference absolute value among the difference absolute values is determined as the correlation direction; and
calculating a pixel value of another color at a pixel position of the target pixel for the demosaicing processing extracted from the mosaic image, wherein a pixel value of a pixel of the another color in the correlation direction determined by the direction determination unit is used to calculate the pixel value of the another color.

13. A image processing method for a single-plate color imaging element comprising: a plurality of pixels including photoelectric conversion elements arranged in a horizontal direction and a vertical direction; and color filters of a predetermined color filter array arranged on the plurality of pixels, wherein the color filter array includes first filters corresponding to a first color that most contributes to obtaining luminance signals and second filters corresponding to two or more second colors other than the first color, the first and second filters being periodically arranged, and two or more pixels out of a plurality of pixels corresponding to the first filters are arranged so that the two or more pixels are adjacent to each other in each of the horizontal direction, the vertical direction, an upper right oblique direction and an upper left oblique direction, the method comprising:
acquiring a mosaic image corresponding to the color filter array from the color imaging element;
acquiring, for a target pixel for demosaicing processing extracted from the mosaic image, pixel values which correspond to the first filters near the target pixel and are conteii iinously arranged in each of the horizontal direction, the vertical direction, the upper right oblique direction and the upper left oblique direction and determining which one of the horizontal direction, the vertical direction, the upper right oblique direction and the upper left oblique direction is a correlation direction of luminance based on the pixel values of the conterminously arranged pixels wherein ratios of pixel values of adjacent pixels are calculated in each of the horizontal direction, the vertical direction, the upper right oblique direction and the upper left direction and a direction with a ratio closest to 1 among the ratios of the horizontal direction, the vertical direction, the upper right oblique direction and the upper left direction is determined as the correlation direction; and
calculating a pixel value of another color at a pixel position of the target pixel for the demosaicing processing extracted from the mosaic image, wherein a pixel value of a pixel of the another color in the correlation direction determined by the direction determination unit is used to calculate the pixel value of the another color.

* * * * *